(12) United States Patent
Kojima et al.

(10) Patent No.: US 11,791,302 B2
(45) Date of Patent: Oct. 17, 2023

(54) THERMOSETTING SHEET, DICING DIE BONDING FILM, AND SEMICONDUCTOR APPARATUS

(71) Applicant: NITTO DENKO CORPORATION, Ibaraki (JP)

(72) Inventors: Rena Kojima, Ibaraki (JP); Tomoaki Ichikawa, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 93 days.

(21) Appl. No.: 17/509,378

(22) Filed: Oct. 25, 2021

(65) Prior Publication Data

US 2022/0130790 A1     Apr. 28, 2022

(30) Foreign Application Priority Data

Oct. 26, 2020   (JP) ................. 2020-178947

(51) Int. Cl.
*H01L 23/00* (2006.01)
*C08J 5/12* (2006.01)
(Continued)

(52) U.S. Cl.
CPC .............. *H01L 24/29* (2013.01); *B32B 27/20* (2013.01); *C08J 5/12* (2013.01); *C08J 5/18* (2013.01); *C08L 33/04* (2013.01); *C09K 5/14* (2013.01); *H01L 21/6836* (2013.01); *H01L 23/49513* (2013.01); *B32B 27/308* (2013.01); *B32B 27/38* (2013.01); *C08J 2333/04* (2013.01); *C08J 2461/08* (2013.01); *C08J 2463/02* (2013.01); *C08J 2463/04* (2013.01); *C08L 2203/30* (2013.01); *C08L 2205/025* (2013.01); *C08L 2205/035* (2013.01); *H01L 24/32* (2013.01); *H01L 24/73* (2013.01); *H01L 2221/68327* (2013.01); *H01L 2224/2929* (2013.01); *H01L 2224/29339* (2013.01); *H01L 2224/29499* (2013.01); *H01L 2224/32225* (2013.01);
(Continued)

(58) Field of Classification Search
CPC .... B32B 27/308; B32B 27/38; H01L 21/6836
See application file for complete search history.

(56) References Cited

U.S. PATENT DOCUMENTS

| | | | |
|---|---|---|---|
| 2021/0139745 A1 | 5/2021 | Ichikawa et al. |
| 2021/0139746 A1 | 5/2021 | Ichikawa et al. |
| 2021/0403784 A1 | 12/2021 | Kojima et al. |

FOREIGN PATENT DOCUMENTS

| | | | |
|---|---|---|---|
| EP | 3819348 A1 | 5/2021 |
| EP | 3819349 A1 | 5/2021 |

(Continued)

OTHER PUBLICATIONS

Machine translation of JP 2015-103580 (Year: 2015).*

(Continued)

*Primary Examiner* — Zachary M Davis
(74) *Attorney, Agent, or Firm* — WHDA, LLP

(57) ABSTRACT

Provided in the present invention is a thermosetting sheet including a thermosetting resin, a thermoplastic resin, a volatile component, and conductive particles. The thermosetting sheet has an arithmetic average roughness Ra of 0.1 μm or more and 1.2 μm or less that is measured in a state before being cured.

5 Claims, 1 Drawing Sheet

(51) Int. Cl.
    *C08J 5/18*           (2006.01)
    *C08L 33/04*         (2006.01)
    *C09K 5/14*          (2006.01)
    *H01L 21/683*       (2006.01)
    *H01L 23/495*       (2006.01)
    *B32B 27/20*         (2006.01)
    *B32B 27/30*         (2006.01)
    *B32B 27/38*         (2006.01)

(52) U.S. Cl.
    CPC ............... *H01L 2224/32245* (2013.01); *H01L 2224/73265* (2013.01)

(56) References Cited

FOREIGN PATENT DOCUMENTS

| | | | | |
|---|---|---|---|---|
| EP | 3929258 A1 | 12/2021 | | |
| JP | 2015103580 A | * 6/2015 | ............. | H01L 24/27 |
| JP | 2017031227 A | * 2/2017 | ............. | C09J 11/04 |
| JP | 2019-21813 A | 2/2019 | | |
| KR | 2012-0109145 A | 10/2012 | | |

OTHER PUBLICATIONS

Machine Translation of JP 2017-031227 (Year: 2017).*
Extended European Search Report dated Mar. 22, 2022, issued in counterpart EP Application No. 21204554.6. (9 pages).

* cited by examiner

THERMOSETTING SHEET, DICING DIE BONDING FILM, AND SEMICONDUCTOR APPARATUS

CROSS-REFERENCE TO RELATED APPLICATION

This application claims priority to Japanese Patent Application No. 2020-178947, the disclosure of which is incorporated herein by reference in its entirety.

FIELD OF THE INVENTION

The present invention relates to a thermosetting sheet, a dicing die bonding film, and a semiconductor apparatus.

BACKGROUND OF THE INVENTION

There is conventionally known a method (die bonding method) for bonding a semiconductor device to a substrate having a semiconductor device mounting area in producing a semiconductor apparatus using a thermosetting sheet (for example JP 2019-021813 A). JP 2019-021813 A discloses a thermosetting sheet including conductive particles and a thermosetting resin.

In such a method, for example, a semiconductor wafer and the thermosetting sheet attached to one side (i.e., a surface opposite to a circuit forming surface) of the semiconductor wafer are diced to thereby obtain a plurality of thermosetting sheets each having one side to which a semiconductor device is attached. The thermosetting sheet having the one side to which a semiconductor device is attached has the other side temporarily bonded to the area of the substrate on which the semiconductor device is mounted at a specific temperature (for example 70° C.), followed by being subjected to heat curing at a higher temperature (for example 200° C.) to be thereby bonded to the adherend. That is, the semiconductor device is bonded to the substrate with the thermosetting sheet interposed therebetween.

SUMMARY OF THE INVENTION

Technical Problem

When the other side of the thermosetting sheet is temporarily bonded to the substrate, there are some cases where the other side of the thermosetting sheet fails to be tightly bonded to the substrate sufficiently, resulting in a gap between the other side of the thermosetting sheet and the substrate. The gap occurring between the other side of the thermosetting sheet and the substrate in the temporarily bonded state remains present as is when the thermosetting sheet is heat-cured to be bonded to the substrate. That is, the gap occurring in the temporarily bonded state is rendered present even in the bonded state. Such a gap occurring between the thermosetting sheet and the substrate is not preferable as it increases thermal resistance and electric resistance at the interface therebetween, and results in insufficient electric conduction and thermal conduction. Nevertheless, no sufficient consideration appears to have been made on increasing the tight adhesiveness between the thermosetting sheet and the substrate in the temporarily bonded state.

In the case where a power semiconductor device is used in a semiconductor apparatus, the power semiconductor device is used with large electric power, consequently generating a large amount of heat. Thus, in the case where the thermosetting sheet as above is used for a power semiconductor device, the thermosetting sheet that has been bonded to the substrate, that is, the cured thermosetting sheet, preferably has high heat dissipation.

The problem of heat generation as aforementioned also occurs in the case where a semiconductor device other than a power semiconductor device is used; however, no sufficient consideration appears to have been made on improving heat dissipation of the cured thermosetting sheet, either.

It is therefore an object of the present invention to provide a thermosetting sheet capable of increasing, in a temporarily bonded state, tight adhesiveness to a substrate having a semiconductor device mounting area, and having a relatively high thermal conductivity after being cured. It is also an object of the present invention to provide a dicing die bonding film including the thermosetting sheet, and a semiconductor apparatus.

Solution to Problem

A thermosetting sheet according to the present invention includes: a thermosetting resin; a thermoplastic resin; a volatile component; and conductive particles, and has an arithmetic average roughness Ra of 0.1 μm or more and 1.2 μm or less that is measured in a state before being cured.

It is preferable that the thermosetting sheet have a maximum height roughness Rz of 1 μm or more and 12 μm or less that is measured in the state before being cured.

In the thermosetting sheet, it is preferable that the conductive particles in the cured thermosetting sheet have a packing ratio P of 30 volume % or more.

In the thermosetting sheet, it is preferable that a thermal conductivity after being cured be 3 W/m·K or more.

A dicing die bonding film according to the present invention includes:
a base layer;
an adhesive layer laminated on the base layer to form a dicing tape; and
a thermosetting sheet laminated on the adhesive layer of the dicing tape, in which
the thermosetting sheet is the thermosetting sheet of any of those above.

A semiconductor apparatus according to the present invention includes:
a substrate having a semiconductor device mounting area; and
a semiconductor device mounted on the semiconductor device mounting area, in which
the semiconductor device is mounted on the semiconductor device mounting area of the substrate via a thermosetting sheet,
the thermosetting sheet is cured,
a bonding ratio of the thermosetting sheet to the substrate is 70% or more, and
the thermosetting sheet is the thermosetting sheet of any of those above.

DETAILED DESCRIPTION OF THE PREFERRED EMBODIMENT

Figure 1:
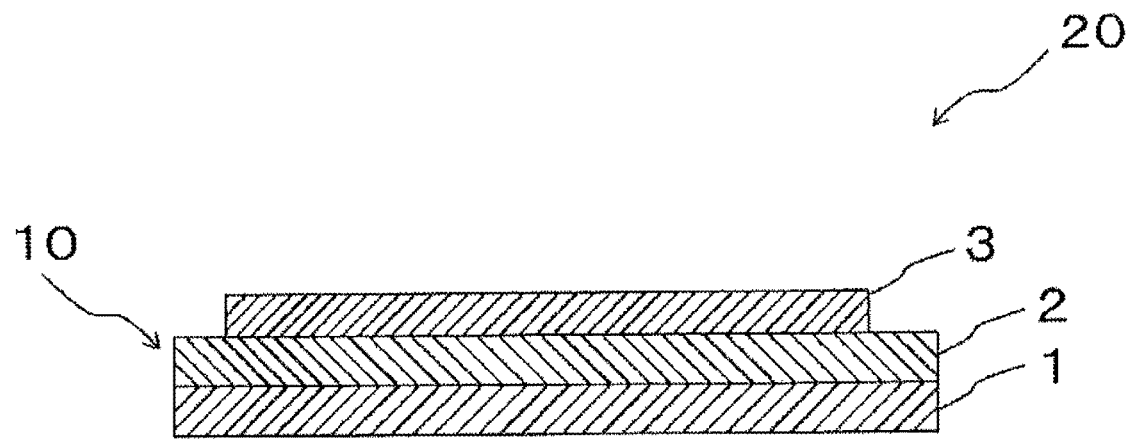
FIG. 1 is a cross-sectional view showing a configuration of a dicing die bonding film according to one embodiment of the present invention.

Hereinafter, a description will be given on one embodiment of the present invention.

Thermosetting Sheet

A thermosetting sheet according to this embodiment includes a thermosetting resin, a thermoplastic resin, a volatile component, and conductive particles. The conductive particles herein mean particles having an electric conductivity measured according to JIS K 0130 (2008) of 100 µS/cm or less. Since the thermosetting sheet according to this embodiment includes the volatile component as described above, the volatile component is caused to volatilize while the thermosetting sheet is being heat-cured to thereby enable the volume of the thermosetting sheet to be reduced. The more the volume of the thermosetting sheet is reduced, the closer the conductive particles become to each other in the thermosetting sheet, allowing the conductive particles to easily form a thermal conduction path in the thermosetting sheet. Thus, the thermosetting sheet after being heat-cured have a relatively high thermal conductivity.

The thermosetting sheet according to this embodiment has an arithmetic average roughness Ra of 0.1 µm or more and 1.2 µm or less that is measured in a state before being cured. Since the arithmetic average roughness Ra measured in the state before being cured is 0.1 µm or more and 1.2 µm or less, occurrence of a gap between the substrate and the thermosetting sheet can be relatively suppressed in a state where the thermosetting sheet is temporarily bonded to the substrate having an area on which a semiconductor device is mounted. This enables the thermosetting sheet according to this embodiment to increase, in a temporarily bonded state, its tight adhesiveness to the substrate having the area on which the semiconductor apparatus is mounted.

The thermosetting sheet according to this embodiment has two adhesive surfaces (i.e., front and back sides of the sheet), at least one of which may have an arithmetic average roughness Ra falling within the above numerical range, but it is preferable that the arithmetic average roughnesses Ra of both the two surfaces fall within the above numerical range.

The arithmetic average roughness Ra in the state before being cured can be measured by a non-contact roughness measurement method for the roughness curve of the surface of the thermosetting sheet in the state before being cured with a cutoff value of 0.08 mm, using a "3CCD Color Confocal Microscope (model: OPTELICS H13000)" and a control software LM eye, which are manufactured by Lasertec Corporation. In the non-contact roughness measurement method, the microscope is manipulated under the conditions where the observation magnification is set to 500 times and the resolution is set to 0.05 µm. The arithmetic average roughness Ra conforms to the definition of JIS B0601: 2013.

The thermosetting sheet according to this embodiment is obtained by, for example, applying a varnish including a thermosetting resin, a thermoplastic resin, a volatile component, and conductive particles to a release film and allowing the varnish to dry, followed by being pressed under vacuum (for example, under a pressure of 3.3 kPa or less) with a single layer or a plurality of layers laminated on each other. Thus, the arithmetic average roughness Ra of the thermosetting sheet can be adjusted to fall within the above numerical range by improving the dispersibility of the conductive particles in a resin component (i.e., the thermosetting resin and the thermoplastic resin) in obtaining the varnish. The dispersibility of the conductive particles in the resin component can be improved by, for example, stirring and mixing a primary mixture including the resin component (primary stirring), followed by stirring and mixing a secondary mixture obtained by adding the conductive particles and the volatile component to the primary mixture (secondary stirring), so that the arithmetic average roughness Ra of the thermosetting sheet can be adjusted to fall within the above numerical range. Use of conductive particles having a spherical shape, which will be described later, can more easily improve the dispersibility of the conductive particles in the resin component. Since the thermosetting sheet according to this embodiment includes the thermoplastic resin and the volatile component in addition to the thermosetting resin as aforementioned, these components are thought to be one of the causes that affect surface smoothness when the thermosetting sheet is pressed under vacuum.

A mass % of the thermoplastic resin in 100 mass % (mass parts) of the thermosetting sheet is preferably 1 mass % or more and 30 mass % or less, more preferably 3 mass % or more and 15 mass % or less. A mass % of the thermoplastic resin in 100 mass % of the thermosetting sheet is preferably 0.5 mass % or more and 10 mass % or less, more preferably 1 mass % or more and 7 mass % or less. A mass % of the conductive particles in 100 mass % of the thermosetting sheet is preferably 60 mass % or more and 95 mass % or less, more preferably 80 mass % or more and 93 mass % or less. A mass ratio of the thermosetting resin in 100 mass % of the resins (i.e., the thermosetting resin and the thermoplastic resin) is preferably 30 mass % or more and 90 mass % or less, more preferably 50 mass % or more and 80 mass % or less.

Examples of the thermosetting resin include an epoxy resin, a phenol resin, an amino resin, an unsaturated polyester resin, a polyurethane resin, a silicone resin, and a thermosetting polyimide resin. Among these, an epoxy resin is preferably used.

Examples of the epoxy resin include the epoxy resins of bisphenol A type, bisphenol F type, bisphenol S type, brominated bisphenol A type, hydrogenated bisphenol A type, bisphenol AF type, biphenyl type, naphthalene type, fluorene type, phenol novolak type, cresol novolak type, ortho-cresol novolak type, trishydroxyphenylmethane type, tetraphenylolethane type, hydantoin type, trisglycidyl isocyanurate type, and glycidyl amine type. Among these, at least one of a bisphenol A type epoxy resin and a cresol novolak type epoxy resin is preferably used, and a bisphenol A type epoxy resin and a cresol novolak type epoxy resin are more preferably used in combination. Examples of the bisphenol A type epoxy resin include an aliphatic modified bisphenol A type epoxy resin.

Examples of the phenol resin as a curing agent for the epoxy resin include a novolak type phenol resin, a resol type phenol resin, a biphenyl type phenol resin, and a polyoxystyrene such as polyparaoxystyrene. Among the above phenol resins, a biphenyl type phenol resin is preferably used.

A thermoplastic resin having a thermosetting functional group can also be used as a thermosetting resin. Examples of the thermoplastic resin having a thermosetting functional group include a thermosetting functional group-containing acrylic resin. Examples of the acrylic resin in the thermosetting functional group-containing acrylic resin include an acrylic resin including a monomer unit derived from a (meth)acrylate ester. For the thermoplastic resin having a thermosetting functional group, a curing agent is selected depending on the kind of the thermosetting functional group.

The thermoplastic resin functions as a binder. Since the thermosetting sheet according to this embodiment includes a thermoplastic resin as a binder, the thermosetting sheet according to this embodiment even after being heat-cured can have a relatively low elasticity. Examples of the thermoplastic resin includes natural rubber, a butyl rubber, an isoprene rubber, a chloroprene rubber, an ethylene-vinyl acetate copolymer, an ethylene-acrylate copolymer, an ethylene-acrylate ester copolymer, a polybutadiene resin, a polycarbonate resin, a thermoplastic polyimide resin, a polyamide resin such as polyamide 6 or polyamide 6,6, a phenoxy resin, an acrylic resin, a saturated polyester resin such as PET or PBT, a polyamide-imide resin, and a fluororesin. These kinds of thermoplastic resins may be individually used, or two or more kinds of them may be used in combination. As the thermoplastic resin, an acrylic resin is preferable in terms of its small amount of ionic impurities and high thermal resistance allowing the thermosetting sheet to easily secure connection reliability.

The acrylic resin is preferably a polymer that includes a monomer unit derived from a (meth)acrylate ester as the largest monomer unit by mass ratio. Examples of the (meth)acrylate ester include (meth)acrylate alkyl ester, (meth)acrylate cycloalkyl ester, and (meth)acrylate aryl ester. The acrylic resin may include a monomer unit derived from other component copolymerizable with the (meth)acrylate ester. Examples of the other component include a carboxyl group-containing monomer, an acid anhydride monomer, a hydroxy group-containing monomer, a glycidyl group-containing monomer, a sulfonic acid group-containing monomer, a phosphate group-containing monomer, a functional group-containing monomer such as acrylic amid or acrylonitrile, and various multifunctional monomers.

The acrylic resin is preferably a carboxyl group-containing acrylic rubber.

The conductive particles preferably include silver particles. The shape of the silver particles may be, for example, a flake shape, a needle shape, a filament shape, a spherical shape, and a flat shape (including a scale-like shape), among which a spherical shape is preferably employed. Use of the silver particles having a spherical shape can increase the dispersibility of the silver particles in the thermosetting sheet. The silver particles having a spherical shape herein mean that the silver particles have a circularity of 0.7 or more in cross section obtained by cutting the thermosetting sheet in its thickness direction. The circularity is an index for obtaining shape complexity on the basis of an area value and a peripheral length value, and where the area is S and the peripheral length is L, the circularity is represented as 4 $\pi S/L^2$. The shape is a true circular shape when the circularity value is 1, and the smaller the circularity value is than 1, the less circular the shape becomes. The circularity can be obtained by cutting the thermosetting sheet in the thickness direction, capturing an SEM image of the cut surface, and analyzing the captured SEM image using a particle image analyzer (PITA-3, manufactured by SEISHIN ENTERPRISE CO., LTD.), specifically analyzing the image using image analysis software such as "ImageJ". The analysis using the particle image analyzer is performed for 10 randomly selected silver particles in the SEM image, and the circularity can be obtained by arithmetically averaging the circularity values obtained for the 10 silver particles. In the case where the thermosetting sheet includes conductive particles other than the silver particles, a reflected electron image is used in which portions having a certain composition are observed to be bright while others having a different composition are observed to be dark, to thereby enable the silver particles and the conductive particles other than the silver particles to be distinguished from each other.

The silver particles have a volume average particle size $D_{50}$ of preferably 0.01 μm or more, more preferably 0.1 μm or more, particularly preferably 0.5 μm or more. The volume average particle size $D_{50}$ of the silver particles being 0.01 μm or more allows the silver particles to be relatively easily dispersed in the thermosetting sheet, and suppresses the surfaces of the silver particles from oxidization which easily occurs when the specific surface area of the silver particles is excessively large, thereby being capable of securing sufficient conductivity of the silver particles. The silver particles having a volume average particle size $D_{50}$ of 0.1 μm or more can be more easily dispersed in the thermosetting sheet, and can have better conductivity. The silver particles having a volume average particles size $D_{50}$ of 0.5 μm or more can be even more easily dispersed in the thermosetting sheet, and can have even better conductivity. The silver particles have a volume average particle size $D_{50}$ of preferably 10 μm or less, more preferably 5 μm or less, particularly preferably 1 μm or less. With the volume average particle size $D_{50}$ of the silver particles being 10 μm or less, the outer surfaces of the silver particles can be molten to the extent sinterable at about a temperature at which the thermosetting resin is cured (for example 200° C.). With the volume average particle size $D_{50}$ of the silver particles being 5 μm or less, the outer surfaces of the silver particles can be more easily molten to the extent sinterable at about a temperature at which the thermosetting resin is cured. Since the volume average particle size $D_{50}$ of the silver particles is 1 μm or less, the outer surfaces of the silver particles can be further easily molten to the extent sinterable at about a temperature at which the thermosetting resin is cured. Further, the silver particles have a volume average particle size $D_{50}$ of preferably 0.01 μm or more and 10 μm or less, more preferably 0.1 μm or more and 5 μm or less, particularly preferably 0.5 μm or more and 1 μm or less.

The silver particles have a volume average particle size $D_{90}$ of preferably 0.05 μm or more, more preferably 0.5 μm or more, particularly preferably 1 μm or more. The silver particles have a volume average particle size $D_{90}$ of preferably 10 μm or less, more preferably 5 μm or less, particularly preferably 2 μm or less. Further, the silver particles have a volume average particle size $D_{90}$ of preferably 0.05 μm or more and 10 μm or less, more preferably 0.5 μm or more and 5 μm or less, particularly preferably 1 μm or more and 2 μm or less.

The volume average particle sizes D50 and D90 of the silver particles can be measured using, for example, a laser diffraction and scattering type particle size distribution measuring apparatus (Microtrac MT3000II series manufactured by MicrotracBEL) on a volume basis.

The silver particles may be silver particles composed of the silver element and other elements (e.g., metal elements) included as inevitable impurity elements, or may be silver particles subjected to surface treatment (for example, silane coupling treatment). Examples of the surface treatment agent for the silver particles include coating agents that are aliphatic acid-based, amine-based, epoxy-based, and the like. Examples of the commercially available silver particles subjected to surface treatment with an aliphatic acid-based coating agent include AG-2-8F manufactured by DOWA Electronics Materials Co., Ltd., and examples of the commercially available silver particles subjected to surface treatment with an epoxy-based coating agent include HP02-B manufactured by MITSUI MINING & SMELTING CO., LTD. The silver particles subjected to surface treatment with an aliphatic acid-based, amine-based, or epoxy-based coating agent may be hereinafter referred to as the silver particles treated with a coating agent. In the thermosetting sheet according to this embodiment, the silver particles treated with a coating agent are preferably used as the silver particles. Since the use of the silver particles treated with a coating agent as the silver particles can increase affinity for the resin component (i.e., the thermosetting resin and the thermoplastic resin) included in the thermosetting sheet, the silver particles are easily dispersed in the thermosetting sheet.

The conductive particles may include nickel particles, copper particles, aluminum particles, carbon black, carbon nanotubes, particles formed by plating the surfaces of core metal particles with a metal such as gold or silver (hereinafter referred to also as plated metal particles), particles formed by coating the surfaces of core resin particles with a metal (hereinafter referred to also as metal-coated resin particles), and the like, other than the silver particles. These kinds of conductive particles may be individually used, or two or more kinds of them may be used in combination.

As the plated metal particles, for example, particles in which nickel particles or copper particles serve as cores and the surfaces of the cores are plated with a noble metal such as gold or silver can be used. As the metal-coated resin particles, for example, particles in which resin particles serve as cores and the surfaces of the cores are coated with a metal such as nickel or gold can be used. In the case where the thermosetting sheet according to this embodiment includes conductive particles other than the silver particles, the plated metal particles are preferably used as the conductive particles, and particles in which copper particles serve as cores and the surfaces of the cores are plated with silver (silver-coated copper particles) are preferably used as the plated metal particles. Examples of the commercially available silver-coated copper particles include: particles obtained by coating product name 1200YP (copper particles) manufactured by MITSUI MINING & SMELTING CO., LTD. with 20 mass % of silver particles; particles obtained by coating product name MA-CO3K (copper particles) manufactured by MITSUI MINING & SMELTING CO., LTD. with 20 mass % of silver particles; and product name AOP-TCY-2 (EN) manufactured by DOWA Electronics Materials Co., Ltd. In the case where the thermosetting sheet according to this embodiment includes conductive particles other than the silver particles, the mass % of the silver particles in 100 mass % of the conductive particles is preferably 10 mass % or more and 95 mass % or less, more preferably 20 mass % or more and 90 mass % or less.

The shape of the conductive particles other than the silver particles may be, for example, a flake shape, a needle shape, a filament shape, a spherical shape, and a flat shape (including a scale-like shape), among which a spherical shape is preferably employed. Use of the particles having a spherical shape as the conductive particles other than the silver particles can increase the dispersibility of the conductive particles other than the silver particles in the thermosetting sheet. Since the spherical particles have a smaller specific surface area than flat-shaped particles, use of the spherical particles as the conductive particles other than the silver particles results in a smaller contact area between the silver particles and the conductive particles other than the silver particles, which can be deemed disadvantageous in terms of the electric conductivity and thermal conductivity. However, since the thermosetting sheet according to this embodiment includes the volatile component that volatizes while the thermosetting sheet is being heat cured, the thermosetting sheet reduces its volume (i.e., the thermosetting sheet shrinks) after being cured to allow the silver particles and the conductive particles other than the silver particles to be positionally close to each other. Thus, even when the spherical particles are used as the conductive particles other than the silver particles, a sufficient contact area between the silver particles and the conductive particles other than the silver particles can still be secured, and thereby the electric conductivity and the thermal conductivity can be sufficiently secured. The particles obtained by coating product name 1200YP manufactured by MITSUI MINING & SMELTING CO., LTD. with 20 mass % of silver particles, the particles obtained by coating product name MA-C03K manufactured by MITSUI MINING & SMELTING CO., LTD. with 20 mass % of silver particles, and product name AOP-TCY-2 (EN) manufactured by DOWA Electronics Materials Co., Ltd., which have been aforementioned, all fall under having a spherical shape.

The conductive particles other than the silver particles have a volume average particle size $D_{50}$ of preferably 0.01 μm or more, more preferably 0.5 μm or more, particularly preferably 1.5 μm or more. The conductive particles other than the silver particles have a volume average particle size $D_{50}$ of preferably 20 μm or less, more preferably 10 μm or less, particularly preferably 5 μm or less. Further, the conductive particles other than the silver particles have a volume average particle size $D_{50}$ of preferably 0.01 μm or more and 20 μm or less, more preferably 0.5 μm or more and 10 μm or less, particularly preferably 1.5 μm or more and 5 μm or less. The volume average particle size $D_{50}$ of the conductive particles other than the silver particles can also be measured in the same manner as for the volume average particle size $D_{50}$ of the silver particles mentioned above.

The conductive particles other than the silver particles have a volume average particle size $D_{90}$ of preferably 0.1 μm or more, more preferably 1 μm or more, particularly preferably 3 μm or more. The conductive particles other than the silver particles have a volume average particle size $D_{90}$ of preferably 30 μm or less, more preferably 15 μm or less, particularly preferably 10 μm or less. Further, the conductive particles other than the silver particles have a volume average particle size $D_{90}$ of preferably 0.1 μm or more and 30 μm or less, more preferably 1 μm or more and 15 μm or less, particularly preferably 3 μm or more and 10 μm or less.

In the case where the thermosetting sheet according to this embodiment includes, as the conductive particles, the silver particles and the conductive particles other than the silver particles, $D_{50}$ of the conductive particles other than the silver particles is preferably larger than $D_{50}$ of the silver particles, and $D_{90}$ of the conductive particles other than the silver particles is preferably larger than $D_{90}$ of the silver particles. This enables the silver particles and the conductive particles other than silver particles to be in contact with each other more sufficiently in the thermosetting sheet, thereby making the thermosetting sheet more excellent in thermal conductivity. A ratio of $D_{50}$ of the conductive particles other than the silver particles to $D_{50}$ of the silver particles ($D_{50}$ of the conductive particles other than the silver particles/$D_{50}$ of the silver particles) is preferably 1.5 or more, more preferably 2.5 or more. The ratio of $D_{50}$ of the conductive particles other than the silver particles to $D_{50}$ of the silver particles is preferably 10 or less, more preferably 6 or less. The ratio of $D_{50}$ of the conductive particles other than the silver particles to $D_{50}$ of the silver particles is preferably 1.5 or more and 10 or less, more preferably 2.5 or more and 6 or less. Further, a ratio of $D_{90}$ of the conductive particles other than the silver particles to $D_{90}$ of the silver particles ($D_{90}$ of the conductive particles other than the silver particles/$D_{90}$ of the silver particles) is preferably 1.5 or more, more preferably 2 or more. The ratio of $D_{90}$ of the conductive particles other than the silver particles to $D_{90}$ of the silver particles is preferably 10 or less, more preferably 5 or less. The ratio of $D_{90}$ of the conductive particles other than the silver particles to $D_{90}$ of the silver particles is preferably 1.5 or more and 10 or less, more preferably 2 or more and 5 or less.

The thermosetting sheet according to this embodiment may include a thermosetting catalyst in terms of sufficiently progressing the curing reaction of the resin component or increasing the curing reaction rate. Examples of the thermosetting catalyst include an imidazole-based compound, a triphenylphosphine-based compound, an amine-based compound, and a trihalogenborane-based compound.

The thermosetting sheet according to this embodiment has a maximum height roughness Rz of preferably 1 µm or more and 12 µm or less that is measured in the state before being cured. With the maximum height roughness Rz measured in the state before being cured being 1 µm or more and 12 µm or less, occurrence of the gap between the substrate and the thermosetting sheet can be even further suppressed in the state where the thermosetting sheet is temporarily bonded to the substrate having an area on which a semiconductor device is mounted. This enables the thermosetting sheet according to this embodiment in a temporarily bonded state to even further increase its tight adhesiveness to the substrate having the area on which the semiconductor apparatus is mounted.

The maximum height roughness Rz in the state before being cured can be measured by the non-contact roughness measurement method for the roughness curve of the surface of the thermosetting sheet in the state before being cured with a cutoff value of 0.08 mm using a "3CCD Color Confocal Microscope (model: OPTELICS 113000)" and a control software LM eye, which are manufactured by Lasertec Corporation. In the non-contact roughness measurement method, the microscope is manipulated under the conditions where the observation magnification is set to 500 times and the resolution is set to 0.05 µm. The maximum height roughness Rz conforms to the definition of JIS B0601: 2013.

The thermosetting sheet according to this embodiment may include a volatile component. The thermosetting sheet according to this embodiment includes preferably 5 mass % or more and 50 mass % or less, more preferably 10 mass % or more and 40 mass % or less, of the volatile component based on the total mass of the organic components (i.e., the thermosetting resin, the thermoplastic resin, and the volatile component) included in the thermosetting sheet. Examples of the volatile component can include an organic compound that includes one or more hydroxy groups and has a boiling point of 250° C. or higher. The boiling point of the organic compound is preferably 350° C. or less. Examples of such an organic compound may include a terpene compound. As the volatile component, isobornyl cyclohexanol expressed by a following formula (1) is preferable among terpene compounds. Isobornyl cyclohexanol is an organic compound with a boiling point of 308 to 318° C., and has characteristics that, when heated under a nitrogen gas flow of 200 mL/min from room temperature (23±2° C.) to 600° C. at a temperature rising rate of 10° C./min, weight reduction becomes significant when the temperature reaches 100° C. and such significant weight reduction continues as the temperature increases, and volatilization and vanishment occurs (i.e., no further weight reduction is found) at 245° C. Isobornyl cyclohexanol has further characteristics that it has an extremely high viscosity of 1,000,000 Pa·s at 25° C. but has a relatively low viscosity of 1000 mPa·s or less at 60° C. The weight reduction refers to a value obtained when the weight reduction ratio at a measurement starting temperature (room temperature) is 0%. Isobornyl cyclohexanol exhibits an extremely high viscosity at 25° C. as aforementioned and thus can keep the thermosetting sheet in a sheet shape at room temperature, but it exhibits a relatively low viscosity at 60° C. as described above to have tackiness. That is, the thermosetting sheet including isobornyl cyclohexanol is excellent in capability of keeping itself in a sheet shape at room temperature, and has tackiness at 60° C. and higher. When a semiconductor device bonded to one side of the thermosetting sheet is mounted on a metal lead frame or the like, it is general that the semiconductor device is temporarily bonded (fixed) to an adherend such as the metal lead frame via the thermosetting sheet at a temperature of 60 to 80° C. In the case where the thermosetting sheet according to this embodiment includes, as the volatile component, isobornyl cyclohexanol, which causes tackiness at 60° C. and higher as aforementioned, the temporary bonding of the thermosetting sheet to an adherend such as a metal lead frame is more improved. That is, the thermosetting sheet in the state of being temporarily bonded suppresses the semiconductor device from being displaced from its mounting position, and is suppressed from rising from the adherend. Thus, the semiconductor device can be reliably bonded to the adherend by heat-curing the thermosetting sheet.

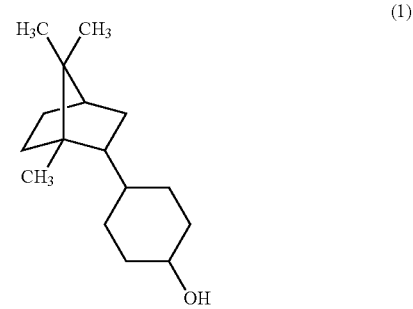 [SMILES: CC1(C)C2CCC1(C)C(C1CCC(O)CC1)C2]

(1)

In the thermosetting sheet according to this embodiment, the packing ratio P of the conductive particles in the thermosetting sheet before being cured is preferably 30 volume % or more, more preferably 40 volume % or more, further preferably 50 volume % or more. The packing ratio P of the particles is preferably 70 volume % or less, more preferably 60 volume % or less. The packing ratio P of the particles falling within the aforementioned value range can further increase heat dissipation of the cured thermosetting sheet. The packing ratio herein refers to a proportion of the conductive particles occupied per unit volume, and as will be described below, the packing ratio can be obtained by capturing an SEM image of a given area of the cross section of the thermosetting sheet made to be exposed by mechanical polishing using a field emission scanning electron microscope to thereby obtain a reflected electron image as image data and then analyze the image data.

The packing ratio P of the particles can be obtained with the following steps: (1) The cured thermosetting sheet is mechanically polished to expose its cross section, and the exposed cross section is subjected to ion polishing using an ion polisher (for example, product name: Cross Section Polisher SM-09010 manufactured by JEOL, Ltd.).

(2) An SEM image (an image obtained by a scanning electron microscope) of a given cross-sectional area of the exposed cross section that has been ion-polished is captured using a field emission scanning electron microscope (for example, product name SU8020 manufactured by Hitachi High-Tech Corporation) at an accelerating voltage of 5 kV and at a magnification of 5000 times to obtain a reflected electron image as an image data.

(3) The obtained image data is subjected to automatic binarization processing, in which the data is binarized into a metal portion and a resin portion using image analysis software (for example, ImageJ).

(4) The total area of the conductive particles portion and the entire (conductive particles portion+resin portion) area are obtained from the binarized image, and the total area of the conductive particles portion is divided by the entire area to obtain the packing ratio P of the conductive particles in the cured thermosetting sheet.

It is preferable that the packing ratio P of the conductive particles be obtained by arithmetically averaging the packing ratios obtained for five cross-sectional areas in the exposed cross section that has been ion-polished.

The thermosetting sheet according to this embodiment has a thickness of preferably 5 μm or more, more preferably 10 μm or more, further preferably 20 μm or more. The thermosetting sheet has a thickness of preferably 150 μm or less, more preferably 100 μm or less, further preferably 80 μm or less. The thermosetting sheet having a thickness of 150 μm or less can have more improved thermal conductivity. The thickness of the thermosetting sheet can be obtained by measuring the thickness thereof at any five positions selected at random using a dial gauge (model R-205 manufactured by PEACOCK), followed by arithmetically averaging these thickness values.

The thermosetting sheet according to this embodiment has a thermal conductivity after being cured of preferably 3 W/m·K or more, more preferably 10 W/m·K or more. The thermal conductivity after being cured falling within the above value range can further increase the conductivity of the cured thermosetting sheet. In the thermosetting sheet according to this embodiment, the upper limit of the thermal conductivity after being cured is generally 100 W/m·R. The thermal conductivity after being cured can be calculated using the equation below for a heat-cured thermosetting sheet obtained by heat-curing the thermosetting sheet according to this embodiment using a pressure cooker apparatus under 0.5 MPa pressure at 200° C. for an hour:

$$\text{Thermal conductivity (W/m·K)} = \text{Thermal diffusivity (m}^2\text{/s)} \times \text{Specific heat (J/g·°C.)} \times \text{Specific weight (g/cm}^3\text{)}$$

The thermal diffusivity (m$^2$/s) in the above equation can be measured by the TWA method (temperature wave analysis, measuring instrument: ai-Phase Mobile manufactured by ai-Phase Co., Ltd.). The specific heat (J/g·° C.) in the above equation can be measured by the DSC method. In the specific heat measurement, DSC6220 manufactured by SII NanoTechnology Inc. is used at a temperature rising rate of 10° C./min and in a temperature range of 20 to 300° C. to obtain the data, based on which the specific heat can be calculated according to the method stipulated in the JIS handbook (Testing Methods for Specific Heat Capacity of Plastics: K-7123). Further, the specific weight in the above equation can be measured by the Archimedes method.

The thermosetting sheet according to this embodiment may include one or more kinds of other components as needed. Examples of the other components include a filler dispersant, a flame retarder, a silane coupling agent, and an ion trapping agent.

Dicing Die Bonding Film

Next, a description will be given on a dicing die bonding film 20 with reference to FIG. 1. Hereinafter, any description that has already been given for describing the thermosetting sheet will not be repeated.

As shown in FIG. 1, the dicing die bonding film 20 according to this embodiment includes a base layer 1, an adhesive layer 2 laminated on the base layer 1 to form a dicing tape 10, and a thermosetting sheet 3 laminated on the adhesive layer 2 of the dicing tape 10. The dicing die bonding film 20 has a semiconductor device attached on the thermosetting sheet 3. The semiconductor device may be a bare wafer. The bare wafer attached to the dicing die bonding film 20 according to this embodiment is cut into a plurality of bare chips by blade dicing, DBG (dicing before grinding) or SDBG (stealth dicing before grinding), or the like. The thermosetting sheet 3 is also cut at the time of the cutting of the bare wafer as above. The thermosetting sheet 3 is cut into pieces each having a size corresponding to the size of each of the plurality of bare chips formed into individual pieces. The plurality of bare chips to which the thermosetting sheet 3 is attached can be thus obtained.

As aforementioned, the thermosetting sheet 3 of the dicing die bonding film 20 is a thermosetting sheet including the thermosetting resin, the thermoplastic resin, and the conductive particles, the thermosetting sheet having an arithmetic average roughness Ra of 0.1 μm or more and 1.2 μm or less that is measured in the state before being cured.

The base layer 1 supports the adhesive layer 2, and the thermosetting sheet 3 laminated on the adhesive layer 2. The base layer 1 includes a resin. Examples of the resin include an olefin-based resin such as polyethylene (PE), polypropylene (PP), or an ethylene-propylene copolymer; a copolymer including ethylene as a monomer component, such as an ethylene-vinyl acetate copolymer (EVA), an ionomer resin, an ethylene-(meth) acrylate copolymer, or an ethylene-(meth)acrylate ester (random or alternate) copolymer; a polyester such as polyethylene terephthalate (PET), polyethylene naphthalene (PEN), or polybutylene terephthalate (PBT); an acrylic resin; polyvinyl chloride (PVC); a polyurethane; a polycarbonate; polyphenylene sulfide (PPS); an amide-based resin such as polyamide or wholly aromatic polyamide (aramid); polyether ether ketone (PEEK); a polyimide; a polyether imide; polyvinylidene chloride; an acrylonitrile butadiene styrene copolymer (ABS); a cellulose-based resin; a silicone resin; and a fluororesin. Among these, polyethylene terephthalate is preferably included in the base layer 1.

The base layer 1 may include one kind of the aforementioned resins, or may include two or more kinds of the aforementioned resins.

A material of the base layer 1 may be a crosslinked polymer or the like of any of the resins (for example, a plastic film). The plastic film may be used without being stretched, or may be subjected to uniaxial or biaxial stretching as needed for use. According to a resin sheet to which heat shrinkability is imparted by stretching or the like, a contact area between the adhesive layer 2 and the thermosetting sheet 3 can be reduced by causing the base layer 1 of the resin sheet to heat shrink after dicing, to thereby allow semiconductor chips (semiconductor devices) to be easily collected.

A surface of the base layer 1 may be subjected to a general surface treatment to increase, for example, its tight adhesiveness to an adjacent layer, or its capability of being secured to the adjacent layer. Examples of the surface treatment include a chemical or physical treatment such as chromic acid treatment, ozone exposure, flame exposure, high-pressure electric shock exposure, or ionized radiation treatment; and coating treatment using a primer.

The base layer 1 has a thickness of preferably 1 μm or more and 1000 μm or less, more preferably 10 μm or more and 500 μm or less, further preferably 20 μm or more and 300 μm or less, particularly preferably 30 μm or more and 200 μm or less. The thickness of the base layer 1 can be obtained using a dial gauge (model R-205 manufactured by PEACOCK), as in the thickness of the thermosetting sheet 3 as aforementioned.

The base layer 1 may include various additives. Examples of the various additives include a colorant, a filler, a plasticizer, an aging retardant, an antioxidant, a surfactant, and a flame retarder.

An adhesive used for forming the adhesive layer 2 is not particularly limited, and for example a general pressure-sensitive adhesive such as an acrylic adhesive or a rubber adhesive can be used. The pressure-sensitive adhesive is preferably an acrylic adhesive including an acrylic polymer as a base polymer in terms of, for example, securing clean washability of electronic components such as semiconductor wafers or glasses, which should be kept away from contamination, using ultrapure water or an organic solvent such as an alcohol.

Examples of the acrylic polymer include an acrylic polymer that includes, as a monomer component, one or more kinds of a (meth)acrylate alkyl ester and a (meth)acrylate cycloalkyl ester. Examples of the (meth)acrylate alkyl ester can include a linear or branched alkyl ester having a 1-30 C, particularly 4-18 C alkyl group, such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, or eicosyl ester. Examples of the (meth) acrylate cycloalkyl ester can include cyclopentyl ester and cyclohexyl ester. The (meth)acrylate ester means at least one of the acrylate ester or the methacrylate ester, and the term (meth) herein is used in the same way as above throughout the specification.

The acrylic polymer may include a unit corresponding to another monomer component that is copolymerizable with the (meth)acrylate alkyl ester or the (meth)acrylate cycloalkyl ester, as appropriate, for the purpose of improving cohesive force, heat resistance, or the like. Examples of such a monomer component include: a carboxyl group-containing monomer such as acrylate, methacrylate, carboxyethyl (meth)acrylate, carboxypentyl (meth)acrylate, itaconic acid, maleic acid, fumaric acid, or crotonic acid; an acid anhydride monomer such as maleic anhydride or itaconic anhydride; a hydroxy group-containing monomer such as 2-hydroxyethyl (meth) acrylate, 2-hydroxypropyl (meth) acrylate, 4-hydroxybutyl (meth)acrylate, 6-hydroxyhexyl (meth)acrylate, 8-hydroxyoctyl (meth) acrylate, 10-hydroxydecyl (meth) acrylate, 12-hydroxylauryl (meth)acrylate, or (4-hydroxymethyl cyclohexyl) methyl (meth)acrylate; a sulfonic acid group-containing monomer such as styrenesulfonic acid, arylsulfonic acid, 2-(meth)acrylamide-2-methylpropanesulfonic acid, (meth)acryloyloxynaphthalenesulfonic acid, or sulfopropyl (meth)acrylate; a phosphate group-containing monomer such as 2-hydroxyethyl acryloyl phosphate; acrylamide; and acrylonitrile. One or more kinds of these copolymerizable monomer components can be used. The amount of these copolymerizable monomers in use is preferably 40 mass % or less of the total monomer components.

The acrylic polymer can further include a multifunctional monomer or the like as a copolymerizing monomer component as needed for crosslinking. Examples of such a multifunctional monomer include hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, tripmethylolpropane tri(meth)acrylate, pentaerythritol tri(meth)acrylate, dipentaerythritol hexa(meth)acrylate, epoxy (meth)acrylate, polyester (meth)acrylate, and urethane (meth)acrylate. One or more kinds of these multifunctional monomers can be used. The amount of these multifunctional monomers in use is preferably 30 mass % or less of the total monomer components in terms of, for example, their adhesion characteristics.

The acrylic polymer can be obtained by polymerizing a single monomer or two or more kinds of monomer mixtures. The polymerization may be performed by any of solution polymerization, emulsion polymerization, bulk polymerization, suspension polymerization, and the like. The acrylic polymer preferably has a small content of low-molecular weight substances in terms of, for example, preventing a clean adherend from contamination. In this regard, the number average molecular weight of the acrylic polymer is preferably 300,000 or more, more preferably about 400,000 to 3,000,000.

An external crosslinking agent can be appropriately added to the adhesive, in order to increase the number average molecular weight of the acrylic polymer or the like, which is the base polymer of the adhesive. Specific examples of the external crosslinking method include a method which includes adding a crosslinking agent such as a polyisocyanate compound, an epoxy compound, an aziridine compound, or a melamine-based crosslinking agent to the adhesive to cause a reaction. In the case where the external crosslinking agent is used, the amount of the external crosslinking agent in use is determined as appropriate, in consideration of the balance with the amount of the base polymer to be crosslinked and its intended use as the adhesive. Generally, the amount of the external crosslinking agent mixed with the base polymer is preferably about 5 parts by mass or less, more preferably 0.1 to 5 parts by mass based on 100 parts by mass of the base polymer.

In addition to the aforementioned components, the adhesive may include additives such as any known tackifier and aging retardant as appropriate.

The adhesive layer 2 can be formed of a radiation-curable adhesive. The radiation-curable adhesive can easily reduce its pressure-sensitive adhesiveness by being irradiated with radiation such as ultraviolet rays to increase the degree of crosslinking. That is, the adhesive layer 2 formed of the radiation-curable adhesive allows the thermosetting sheet 3 to be in sufficient contact with the adhesive layer 2 without being subjected to radiation irradiation before dicing, and reduces its pressure-sensitive adhesiveness by being subjected to radiation irradiation after dicing so that semiconductor chips (semiconductor devices) can be easily picked up or collected.

The radiation-curable adhesive is not particularly limited, and can be any adhesive as long as it has a radiation-curable functional group of a carbon-carbon double bond or the like, and exhibits pressure-sensitive adhesiveness. Examples of the radiation-curable adhesive include an additive-type radiation-curable adhesive in which a radiation-curable monomer component or oligomer component is mixed with a general pressure-sensitive adhesive such as an acrylic adhesive or a rubber adhesive.

Examples of the radiation-curable monomer component include urethane (meth) acrylate, trimethylolpropane tri (meth)acrylate, tetramethylolmethane tetra(meth)acrylate, pentaerythritol tri(meth)acrylate, pentaerythritol tetra(meth) acrylate, dipentaerythritol monohydroxy penta(meth)acrylate, dipentaerythritol hexa(meth)acrylate, and 1,4-butanediol di(meth)acrylate. Examples of the radiation-curable oligomer component include a urethane-based oligomer, a polyether-based oligomer, a polyester-based oligomer, a polycarbonate-based oligomer, a polybutadiene-based oligomer, and various other oligomers, and any of these oligomers having a molecular weight of about 100 to 30,000 is preferable. The mixing amount of the radiation-curable monomer component or the radiation-curable oligomer component is preferably such an amount as to allow the adhesive layer 2 to appropriately reduce its pressure-sensitive adhesiveness after radiation irradiation. Generally, the mixing amount of the radiation-curable monomer component or the radiation-curable oligomer component is, for example, preferably 5 to 500 parts by mass, more preferably 40 to 150 parts by mass, based on the 100 parts by mass of the base polymer such as an acrylic polymer constituting the adhesive.

In addition to the additive-type radiation-curable adhesives mentioned above, the radiation-curable adhesive can be an intrinsic-type radiation-curable adhesive in which a polymer having a carbon-carbon double bond in a side chain or the main chain of the polymer or at a terminal of the main chain is used as the base polymer. The intrinsic-type radiation-curable adhesive does not need to include an oligomer component or the like, which is a low-molecular component, or includes a relatively small content of the oligomer component or the like. Thus, the use of the intrinsic-type radiation-curable adhesive suppresses the oligomer component or the like from migrating within the adhesive layer 2 over time. As a result, the adhesive layer 2 can have a relatively stable layer structure.

The base polymer having the carbon-carbon double bond is not particularly limited as long as it has a carbon-carbon double bond and has pressure-sensitive adhesiveness. Such a base polymer preferably has an acrylic polymer as the basic skeleton. Examples of the basic skeleton of the acrylic polymer include the aforementioned acrylic polymers.

A method for introducing the carbon-carbon double bond into the acrylic polymer is not particularly limited and various methods can be employed, but when adopting a method in which the carbon-carbon double bond is introduced in a polymer side chain, molecular design can be easily made. Examples of the method include a method in which a monomer having a functional group is in advance caused to copolymerize with the acrylic polymer, followed by subjecting a compound having the carbon-carbon double bond and a functional group that can react with the functional group of the monomer to a condensation reaction or an addition reaction in the state where the carbon-carbon double bond is kept radiation-curable.

Examples of the combination of the functional groups include: a carboxylic acid group and an epoxy group, a carboxylic acid group and an aziridinyl group, and a hydroxy group and an isocyanate group. Among these combinations of the functional groups, a combination of a hydroxy group and an isocyanate group is preferable in terms of easy reaction tracking. In these combinations of the functional groups, any of the functional groups can be present on any side of the acrylic polymer and the compound having the carbon-carbon double bond, as long as the combination of the functional groups generates an acrylic polymer having the carbon-carbon double bond. In the case of the aforementioned preferable combination, however, it is preferable that the acrylic polymer have a hydroxy group and the compound having the carbon-carbon double bond have an isocyanate group. In this case, examples of the isocyanate compound having the carbon-carbon double bond include methacryloyl isocyanate, 2-methacryloyloxyethyl isocyanate, and m-isopropenyl-α,α-dimethylbenzyl isocyanate. Examples of the acrylic polymer include a polymer formed by copolymerizing an ether-based compound or the like such as the aforementioned hydroxy group-containing monomer, 2-hydroxyethyl vinyl ether, 4-hydroxybutyl vinyl ether, or diethylene glycol monovinyl ether.

In the intrinsic-type radiation-curable adhesive, the base polymer having the carbon-carbon double bond (in particular an acrylic polymer) may be individually used, but the radiation-curable monomer component or the radiation-curable oligomer component can be added in such an amount as not to impair the characteristics of the adhesive. The radiation-curable oligomer component or the like is included generally in the range of 30 parts or less by mass, preferably in the range of 1 to 10 parts by mass, based on 100 parts by mass of the base polymer.

The radiation-curable adhesive includes a photopolymerization initiator in the case of being cured by, for example, ultraviolet rays. Examples of the photopolymerization initiator include an α-ketol-based compound such as 4-(2-hydroxyethoxy)phenyl(2-hydroxy-2-propyl) ketone, α-hydroxy-α,α'-dimethylacetophenone, 2-methylhydroxypropiophenone, or 1-hydroxycyclohexyl phenyl ketone; an acetophenone-based compound such as methoxyacetophenone, 2,2-dimethoxy-2-phenylacetophenone, 2,2-diethoxyacetophenone, or 2-methyl-1-[4-(methylthio)-phenyl]-2-morpholinopropane-1; an benzoin ether-based compound such as benzoin ethyl ether, benzoin isopropyl ether, or anisoin methyl ether; a ketal-based compound such as benzil dimethylketal; an aromatic sulfonyl chloride-based compound such as 2-naphthalene sulfonyl chloride; a photoactive oxime-based compound such as 1-phenone-1,1-propanedione-2-(o-ethoxycarbonyl)oxime; a benzophenone-based compound such as benzophenone, benzoyl benzoic acid, or 3,3'-dimethyl-4-metoxybenzophenone; a thioxanthone-based compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, or 2,4-diisopropylthioxanthone; camphorquinone; halogenated ketone; acylphosphine oxide; and acylphosphonate. The mixing amount of the photopolymerization initiator is, for example, 0.05 to 20 parts by mass based on 100 parts by mass of an acrylic polymer as the base polymer constituting the adhesive.

Examples of the radiation-curable adhesive include a rubber or acrylic adhesive disclosed in JP S60-196956 A, which includes: a photopolymerizable compound such as an addition polymerizable compound having two or more unsaturated bonds or alkoxysilane having an epoxy group; and a photopolymerization initiator such as a carbonyl compound, an organic sulfur compound, a peroxide, amine, or an onium salt-based compound.

In the case where curing inhibition by oxygen occurs at the time of radiation irradiation, it is desirable to keep the surface of the radiation-curable adhesive layer 2 away from oxygen (air) using some method. For example, the method can be performed by covering the surface of the adhesive layer 2 with a separator, or by irradiating the surface of the adhesive layer 2 with radiation such as ultraviolet rays in a nitrogen gas atmosphere.

The thickness of the adhesive layer 2 is not particularly limited, but is preferably 1 to 50 μm, more preferably 2 to 30 μm, further preferably 5 to 25 μm, in terms of both preventing chipping of a chip cutting surface and achieving the capability of enabling the thermosetting sheet 3 to be secured to the adhesive layer 2 and kept in the secured state.

Semiconductor Apparatus

The semiconductor apparatus according to this embodiment includes a substrate having a semiconductor device mounting area, and a semiconductor device mounted on the semiconductor device mounting area, in which the semiconductor device is mounted on the semiconductor device mounting area of the substrate via the thermosetting sheet, the thermosetting sheet is cured, and a bonding ratio of the thermosetting sheet to the substrate is 70% or more. The bonding ratio of the thermosetting sheet to the substrate herein means a ratio of an area of the thermosetting sheet actually attached to the semiconductor device mounting area to the total area of the thermosetting sheet to be attached to the semiconductor device mounting area.

Figure 2:
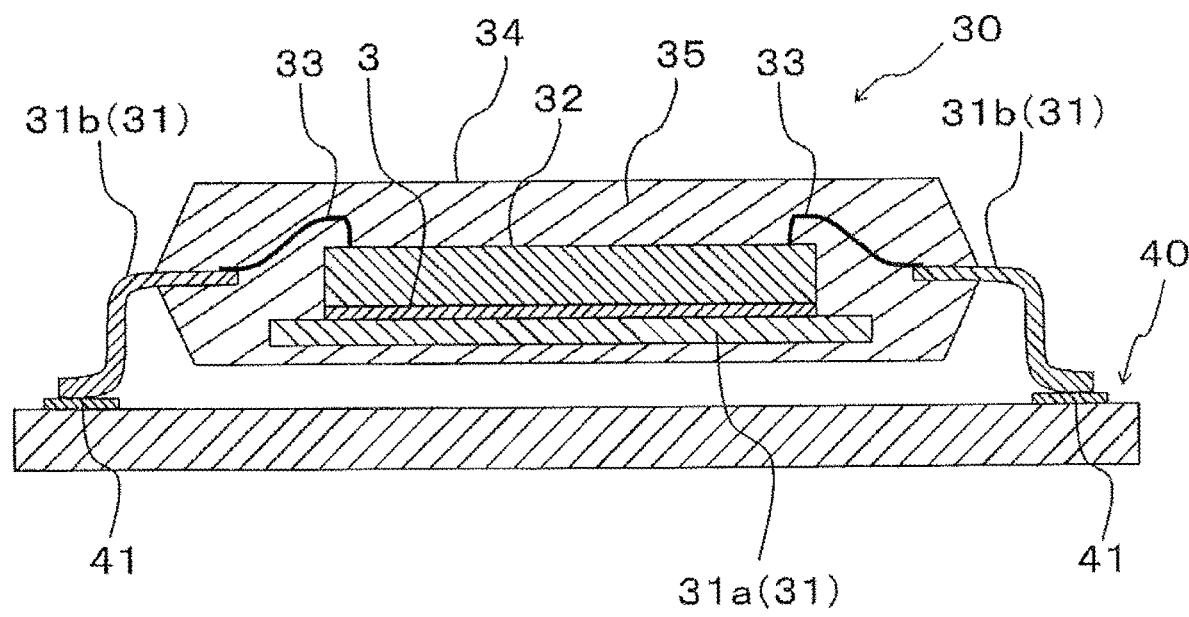
FIG. 2 shows a cross-sectional view showing a configuration of a semiconductor apparatus according to one embodiment of the present invention.

Examples of the semiconductor apparatus according to this embodiment include an apparatus configured as shown in FIG. 2. As shown in FIG. 2, a semiconductor apparatus 30 includes: a lead frame substrate 31 that includes a die pad 31a having a substantially rectangular shape as viewed from top and a pair of leads 31b respectively extending from both ends of the die pad 31a; a semiconductor device 32 mounted to the die pad 31a of the lead frame substrate 31 while being laminated on a thermosetting sheet 3; a pair of wires 33 for electrical connection between the semiconductor device 32 and the respective pair of leads 31b; and a hollow package 34 in which the entire die pad area 31a, part of the pair of leads 31b, the entire semiconductor device 32 laminated on the thermosetting sheet 3, and the entire pair of wires 33 are accommodated, and a gap formed between the package 34 and the semiconductor device 32 or the like is filled with a mold resin 35. That is, in the semiconductor apparatus 30 as shown in FIG. 2, the lead frame substrate 31 serves as a substrate having a semiconductor device mounting area, and the die pad 31a serves as the semiconductor device mounting area.

In the semiconductor apparatus 30, the pair of leads 31b each have one end side arranged above an upper surface of each of the both ends of the die pad 31a, and extend in a direction parallel to the upper surface of the die pad 31a (hereinafter referred to also as horizontal direction), and further extend downward in a direction vertical to the upper surface of the die pad 31a (hereinafter referred to simply as vertically downward). A portion of each of the pair of leads 31b that extends in the horizontal direction penetrates through the package 34. That is, in the semiconductor apparatus 30, the portion of the lead 31b extending in the horizontal direction is partially accommodated in the package 34, and a remainder of the portion thereof as well as the entire portion of the lead 31b extending vertically downward are exposed outside the package 34.

As shown in FIG. 2, the semiconductor apparatus 30 is mounted on a wiring board 40 including a pair of electrodes 41 arranged at an interval from each other on a surface of the wiring board 40 for use. More specifically, the semiconductor apparatus 30 is mounted on the wiring board 40 for use by connecting vertically downwardly extending portions of the pair of leads 31b to the respective pair of electrodes 41 by, for example, soldering.

In the semiconductor apparatus 30 according to this embodiment, the bonding ratio of the thermosetting sheet to the substrate is preferably 80% or more, more preferably 90% or more. In the semiconductor apparatus according to this embodiment, the bonding ratio of the thermosetting sheet before being cured to the substrate is preferably 70% or more, more preferably 80% or more, particularly preferably 90% or more. Further, in the semiconductor apparatus according to this embodiment, the bonding ratio of the thermosetting sheet to the lead frame substrate having the die pad area is preferably 70% or more, more preferably 80% or more, particularly preferably 90% or more. In the semiconductor apparatus according to this embodiment, the bonding ratio of the thermosetting sheet before being cured to the lead frame substrate having the die pad area is preferably 70% or more, more preferably 80% or more, particularly preferably 90% or more.

In the semiconductor apparatus according to this embodiment, the thermosetting sheet is, as aforementioned, a thermosetting sheet including the thermosetting resin, the thermoplastic resin, and the conductive particles, the thermosetting sheet having an arithmetic average roughness Ra of 0.1 μm or more and 1.2 μm or less that is measured in the state before being cured.

The bonding ratio of the thermosetting sheet to the substrate can be obtained with the following steps:
  (1) The opposite side to a side of a thermosetting sheet (or a laminated body formed to have a plurality of thermosetting sheets laminated on each other) on which a silicon chip (bare chip) is mounted is attached to a semiconductor device mounting area of a substrate, to thereby obtain a test piece for evaluating a bonding ratio.
  (2) Using an ultrasonic image apparatus (model: FineSAT FS200II manufactured by Hitachi Kenki Finetech Co., Ltd.; hereinafter referred to also as SAT), a SAT image of the test piece for evaluating the bonding ratio is captured by the reflection method. In capturing the image, a gate is adjusted to conform to an echo of the bonded portion between the substrate and the thermosetting sheet, the echo being displayed on the waveform monitor of the ultrasonic image apparatus, with a pixel set to 1, a gain set to 25 dB, and a Z-axis height set to 11.34 mm.
  (3) The obtained SAT image is subjected to automatic binarization processing, in which the image is binarized into a bonded portion between the substrate and the thermosetting sheet (hereinafter referred to also as bonded portion) and a non-bonded portion between the substrate and the thermosetting sheet (hereinafter referred to also as non-bonded portion), using ImageJ, image analysis software. The threshold is set to 82.
  (4) The area of the bonded portion and the area of the non-bonded portion are obtained from the binarized image, the area value of the bonded portion is divided by the sum of the area of the bonded portion and the area of the non-bonded portion, and the obtained value is then multiplied by 100 to thereby obtain the bonding ratio of the thermosetting sheet to the substrate.

In the binarized image, the bonded portion is shown in black while the non-bonded portion is shown in white.

The thermosetting sheet, the dicing die bonding film, and the semiconductor apparatus according to the present invention are not limited to the aforementioned embodiment. The thermosetting sheet, the dicing die bonding film, and the semiconductor apparatus according to the present invention are not limited by the aforementioned operational advantages, either. Various modifications can be made for the thermosetting sheet, the dicing die bonding film, and the semiconductor apparatus according to the present invention without departing from the gist of the present invention.

The matters disclosed herein include the following:

(1)

A thermosetting sheet including: a thermosetting resin; a thermoplastic resin; a volatile component; and conductive particles, the thermosetting sheet having an arithmetic average roughness Ra of 0.1 μm or more and 1.2 μm or less that is measured in a state before being cured.

According to such a configuration, the arithmetic average roughness Ra measured in the state before being cured is 0.1 μm or more and 1.2 μm or less, and thus occurrence of a gap between a substrate having a semiconductor device mounting area and the thermosetting sheet can be relatively suppressed in a temporarily bonded state. This can increase tight adhesiveness between the thermosetting sheet and the substrate. Since the thermosetting sheet includes the volatile component, the volatile component is caused to volatilize while the thermosetting sheet is being heat-cured to thereby enable the volume of the thermosetting sheet to be reduced. The more the volume of the thermosetting sheet is reduced, the closer the conductive particles become to each other in the thermosetting sheet, allowing the conductive particles to easily form a thermal conduction path in the thermosetting sheet. This allows thermal conductivity after being cured to be relatively high. Further, since the thermosetting sheet includes the thermoplastic resin, the thermosetting sheet even after being heat-cured can have relatively low elasticity. This can increase tight adhesiveness between the thermosetting sheet and the substrate even after being heat-cured, and thus can more sufficiently increase thermal conductivity. As described above, the thermosetting sheet according to the present invention has high tight adhesiveness between the thermosetting sheet and the substrate having the semiconductor device mounting area in the temporarily bonded state, and also has relatively high thermal conductivity after being cured.

(2)

The thermosetting sheet of (1) above, having a maximum height roughness Rz of 1 μm or more and 12 μm or less that is measured in the state before being cured.

According to such a configuration, the tight adhesiveness between the thermosetting sheet and the substrate can be even further increased.

(3)

The thermosetting sheet of (1) or (2) above, in which the conductive particles in the cured thermosetting sheet have a packing ratio P of 30 volume % or more.

According to such a configuration, the cured thermosetting sheet can have even higher thermal conductivity.

(4)

The thermosetting sheet of any of (1) to (3) above, in which a thermal conductivity after being cured is 3 W/m·K or more.

(5)

The thermosetting sheet of (4) above, in which the thermal conductivity after being cured is 100 W/m·K or less.

According to such a configuration, the cured thermosetting sheet can have even higher thermal conductivity.

(6)

A dicing die bonding film including:

a base layer;

an adhesive layer laminated on the base layer to form a dicing tape; and a thermosetting sheet laminated on the adhesive layer of the dicing tape, in which the thermosetting sheet is the thermosetting sheet of any of those above.

According to such a configuration, the dicing die bonding film has, in a temporarily bonded state, an increased tight adhesiveness to the substrate having an area on which the semiconductor device is mounted, and has relatively high thermal conductivity after being cured.

(7)

A semiconductor apparatus including:

a substrate having a semiconductor device mounting area; and a semiconductor device mounted on the semiconductor device mounting area, in which the semiconductor device is mounted on the semiconductor device mounting area of the substrate via a thermosetting sheet, the thermosetting sheet is cured, a bonding ratio of the thermosetting sheet to the substrate is 70% or more, and the thermosetting sheet is the thermosetting sheet of any of those above.

According to such a configuration in which the bonding ratio of the thermosetting sheet to the substrate is 70% or more, the semiconductor apparatus has the thermosetting sheet sufficiently bonded to the semiconductor device mounting area of the substrate. This allows the semiconductor apparatus to have relatively high thermal conductivity after being cured.

EXAMPLES

Hereinafter, the present invention will be more specifically described by way of examples. The following examples are provided for more specifically describing the present invention, and do not intend to limit the scope of the present invention.

Example 1

A mixture of materials having the respective mass ratios shown in the column "Example 1" of Table 1 below was stirred and mixed using a hybrid mixer (product name: HM-500 manufactured by KEYENCE CORPORATION) in the "stirring mode" to prepare a varnish. The stirring and mixing using the hybrid mixer was performed by three steps. Specifically, first, a primary mixture including a thermosetting resin and a thermoplastic resin was stirred and mixed for three minutes (i.e., primary stirring), then a secondary mixture obtained by adding conductive particles and a volatile agent to the primary mixture was stirred and mixed for 6 minutes (i.e., secondary stirring), and further a tertiary mixture obtained by adding a catalyst and a solvent to the secondary mixture was stirred and mixed for 3 minutes (i.e., tertiary stirring). The varnish was applied to one side of a release treatment film (product name: MRA38, with a thickness of 38 μm, manufactured by Mitsubishi Chemical Corporation), followed by being allowed to dry at 100° C. for 2 minutes to obtain a thermosetting sheet having a thickness of 30 μm. The materials shown in Table 1 below are as follows:

Phenol Resin

MEHC-7851S (biphenyl type phenol resin, phenol equivalent of 209 g/eq), manufactured by MEIWA PLASTIC INDUSTRIES, LTD.

Solid Epoxy Resin

KI-3000-4 (cresol novolak type multifunctional epoxy resin, epoxy equivalent of 200 g/eq), manufactured by Nippon Steel & Sumikin Chemical Co., Ltd.

Liquid Epoxy Resin

EXA-4816 (aliphatic modified bisphenol A type epoxy resin (bifunctional type), epoxy equivalent of 403 g/eq), manufactured by DIC Corporation Silver (Ag)-Coated Copper (Cu) Particles Product name AOP-TCY-2 (EN) (spherical copper particles coated with 20 mass % of silver particles; the particles have a spherical shape) manufactured by DOWA Electronics Materials Co., Ltd.

Silver (Ag) Particles

AG-2-8F (silver particles subjected to surface treatment with an aliphatic acid-based coating agent; the particles have a spherical shape) manufactured by DOWA Electronics Materials Co., Ltd.

Volatile Agent (Isobornyl Cyclohexanol (MTPH))

MTPH manufactured by Nippon Terpene Chemicals, Inc.

Acrylic Resin Solution

TEISANRESIN SG-70L (including MEK and toluene as solvents, solid content of 12.5%, glass transition temperature of −13° C., mass-average molecular weight of 900,000, acid value of 5 mg/KOH, carboxyl group-containing acrylic copolymer), manufactured by Nagase ChemteX Corporation Coupling Agent KBE-846 (bis(triethoxysilylpropyl)tetrasulfide), manufactured by Shin-Etsu Chemical Co., Ltd.

Catalyst

TPP-K (tetraphenylphosphonium tetraphenylborate), manufactured by HOKKO CHEMICAL INDUSTRY CO., LTD.

Solvent

Methyl ethyl ketone (MEK)

Table 3 below shows the mass ratios respectively of the silver-coated copper particles and the silver particles based on 100 mass parts of the conductive particles (silver-coated copper particles and silver particles), and Table 2 below shows the mass ratio of the epoxy resin (solid and liquid) based on 100 mass parts of the thermosetting sheet, the mass ratio of the phenol resin based on 100 mass parts of the thermosetting sheet, the mass ratio of the acrylic resin based on 100 mass parts of the thermosetting sheet, and the mass ratio of isobornyl cyclohexanol based on 100 mass parts of the organic components (phenol resin, epoxy resin (solid and liquid), acrylic resin solution, and isobornyl cyclohexanol). Note that the silver-coated copper particles (AOP-TCY-2 (EN)) and the silver particles (AG-2-8F) each had a circularity of 70% or more that was measured as above, and are thus denoted to have a "spherical shape".

Example 2

A thermosetting sheet according to Example 2 was obtained in the same manner as in Example 1, except that a mixture of materials having the respective mass ratios shown in the column Example 2 of Table 1 below was obtained.

Example 3

A thermosetting sheet according to Example 3 was obtained in the same manner as in Example 1, except that a mixture of materials having the respective mass ratios shown in the column Example 3 of Table 1 below was obtained.

Example 4

A thermosetting sheet according to Example 4 was obtained in the same manner as in Example 1, except that HP02-B (silver particles subjected to surface treatment with an epoxy-based coating agent; the particles have a spherical shape) manufactured by MITSUI MINING & SMELTING CO., LTD. was used as silver particles and a mixture of materials having the respective mass ratios shown in the column Example 4 of Table 1 below was obtained. Note that HP02-B had a circularity of 70% or more that was measured as above, and is thus denoted to have a spherical shape.

Example 5

A thermosetting sheet according to Example 5 was obtained in the same manner as in Example 1, except that HP02-B manufactured by MITSUI MINING &

SMELTING CO., LTD. was used as silver particles and a mixture of materials having the respective mass ratios shown in the column Example 5 of Table 1 below was obtained.

Example 6

A thermosetting sheet according to Example 6 was obtained in the same manner as in Example 1, except that 1200Y manufactured by MITSUI MINING & SMELTING CO., LTD. coated with 20 mass % of silver particles (1200Y subjected to surface treatment with an aliphatic acid-based coating agent; the particles have a spherical shape; hereinafter referred to also as 20% Ag/1200Y) was used as silver-coated copper particles, and a mixture of materials having the respective mass ratios shown in the column Example 6 of Table 1 below was obtained. Note that 20% Ag/1200Y had a circularity of 70% or more that was measured as above, and is thus denoted to have a spherical shape.

Example 7

A thermosetting sheet according to Example 7 was obtained in the same manner as in Example 1, except that MA-C03K manufactured by MITSUI MINING & SMELTING CO., LTD. coated with 20 mass % of silver particles (MA-C03K subjected to surface treatment with an aliphatic acid-based coating agent; the particles have a spherical shape; hereinafter referred to also as 20% Ag/03K) was used as silver-coated copper particles, and a mixture of materials having the respective mass ratios shown in the column Example 7 of Table 1 below was obtained. Note that 20% Ag/03K had a circularity of 70% or more that was measured as above, and is thus denoted to have a spherical shape.

Comparative Example 1

A thermosetting sheet according to Comparative Example 1 was obtained in the same manner as in Example 1, except that 1200YP manufactured by MITSUI MINING & SMELTING CO., LTD. coated with 10 mass % of silver particles (1200YP subjected to surface treatment with an epoxy-based coating; the particles have a flat shape; hereinafter referred to also as 10% Ag/1200YP-B) was used as silver-coated copper particles, HP02A (subjected to surface treatment with an aliphatic acid-based coating agent; the particles have a spherical surface) manufactured by MITSUI MINING & SMELTING CO., LTD. was used as silver particles, and a mixture of materials having the respective mass ratios shown in the column Comparative Example 1 of Table 1 below was obtained. Note that HP02A had a circularity of 70% or more that was measured as above, and is thus denoted to have a spherical shape.

Comparative Example 2

A thermosetting sheet according to Comparative Example 2 was obtained in the same manner as in Example 1, except that 1200YP manufactured by MITSUI MINING & SMELTING CO., LTD. coated with 10% of silver particles (10% Ag/1200YP-B) was used as silver-coated copper particles, HP02A-B (subjected to surface treatment with an epoxy-based coating agent; the particles have a spherical surface) manufactured by MITSUI MINING & SMELTING CO., LTD. was used as silver particles, and a mixture of materials having the respective mass ratios shown column Comparative Example 2 of Table 1 below was obtained. Note that HP02A-B had a circularity of 70% or more that was measured as above, and is thus denoted to have a spherical shape.

Comparative Example 3

A thermosetting sheet according to Comparative Example 3 was obtained in the same manner as in Example 1, except that 1200YP manufactured by MITSUI MINING & SMELTING CO., LTD. coated with 10% of silver particles (10% Ag/1200YP-B) was used as silver-coated copper particles, HP02A-B (subjected to surface treatment with an epoxy-based coating agent; the particles have a spherical surface) manufactured by MITSUI MINING & SMELTING CO., LTD. was used as silver particles, and a mixture of materials having the respective mass ratios shown in the column Comparative Example 3 of Table 1 below was obtained.

TABLE 1

|  | Unit | Ex. 1 | Ex. 2 | Ex. 3 | Ex. 4 | Ex. 5 |
|---|---|---|---|---|---|---|
| Phenol resin | Mass parts | 0.74 | 0.45 | 0.38 | 0.72 | 0.72 |
| Solid epoxy resin | Mass parts | 0.49 | 0.29 | 0.25 | 0.47 | 0.47 |
| Liquid epoxy resin | Mass parts | 0.21 | 0.13 | 0.11 | 0.20 | 0.20 |
| Ag-coated Cu particles | Mass parts | 14.4 | 14.5 | 14.2 | 9.5 | 10.7 |
| Ag particles | Mass parts | 33.6 | 33.8 | 33.1 | 22.1 | 24.9 |
| Volatile agent | Mass parts | 0.72 | 0.72 | 0.62 | 0.86 | 0.86 |
| Acrylic resin solution | Mass parts | 11.56 | 16.18 | 13.96 | 4.81 | 4.81 |
| Coupling agent | Mass parts | 0.11 | 0.11 | 0.10 | 0.09 | 0.09 |
| Catalyst | Mass parts | 0.009 | 0.009 | 0.007 | 0.002 | 0.002 |
| MEK | Mass parts | 11.0 | 7.0 | 8.5 | 10.0 | 12.0 |
|  | Unit | Ex. 6 | Ex. 7 | C. Ex. 1 | C. Ex. 2 | C. Ex. 3 |
| Phenol resin | Mass parts | 0.74 | 0.74 | 1.33 | 0.98 | 0.98 |
| Solid epoxy resin | Mass parts | 0.49 | 0.49 | 0.86 | 0.65 | 0.65 |
| Liquid epoxy resin | Mass parts | 0.21 | 0.21 | 0.37 | 0.28 | 0.28 |
| Ag-coated Cu particles | Mass parts | 14.4 | 14.4 | 23.4 | 24.9 | 10.5 |
| Ag particles | Mass parts | 33.6 | 33.6 | 7.4 | 7.8 | 24.6 |
| Volatile agent | Mass parts | 0.72 | 0.72 | 0.91 | 1.17 | 1.17 |
| Acrylic resin solution | Mass parts | 11.56 | 11.56 | 8.76 | 6.55 | 6.55 |
| Coupling agent | Mass parts | 0.11 | 0.11 | 0.17 | 0.12 | 0.12 |
| Catalyst | Mass parts | 0.009 | 0.009 | 0.004 | 0.004 | 0.004 |
| MEK | Mass parts | 11.0 | 11.0 | 11.0 | 12.0 | 13.0 |

TABLE 2

|  | Ex. 1 | Ex. 2 | Ex. 3 | Ex. 4 | Ex. 5 |
|---|---|---|---|---|---|
| Mass parts of epoxy resin | 1.35 | 0.81 | 0.72 | 1.97 | 1.76 |
| Mass parts of phenol resin | 1.44 | 0.86 | 0.76 | 2.10 | 1.88 |
| Mass parts of acrylic resin | 2.79 | 3.89 | 3.46 | 1.75 | 1.56 |
| Mass parts of volatile agent (MTPH) | 19.9 | 19.9 | 19.9 | 30.1 | 30.1 |
|  | Ex. 6 | Ex. 7 | C. Ex. 1 | C. Ex. 2 | C. Ex. 3 |
| Mass parts of epoxy resin | 1.35 | 1.35 | 3.46 | 2.51 | 2.36 |
| Mass parts of phenol resin | 1.44 | 1.44 | 3.73 | 2.68 | 2.52 |
| Mass parts of acrylic resin | 2.79 | 2.79 | 3.08 | 2.23 | 2.09 |
| Mass parts of volatile agent (MTPH) | 19.9 | 19.9 | 20.0 | 30.1 | 30.1 |

Volume Average Particle Sizes $D_{50}$ and $D_{90}$ of Silver Particles and Silver-Coated Copper Particles The volume average particle sizes $D_{50}$ and $D_{90}$ of the silver particles and the silver-coated copper particles before being mixed were measured using a laser diffraction and scattering type particle size distribution measuring apparatus (Microtrac MT3000II series manufactured by Microtrac-BEL). The measured average particle sizes $D_{50}$ and $D_{90}$ of the silver particles and the silver-coated copper particles included in the thermosetting sheet according to each of Examples and Comparative Examples are shown in Table 3 below.

Packing Ratio of Conductive Particles

The packing ratio P of the particles was obtained for the thermosetting sheet according to each of Examples and Comparative Examples with the following steps:

(1) The cured thermosetting sheet is mechanically polished to expose its cross section, and the exposed cross section is subjected to ion polishing using an ion polisher (for example, product name: Cross Section Polisher SM-09010 manufactured by JEOL, Ltd.).
(2) An SEM image (an image obtained by a scanning electron microscope) of a given cross-sectional area of the exposed cross section that had been ion-polished is captured using a field emission scanning electron microscope SU8020 (manufactured by Hitachi High-Tech Corporation) at an accelerating voltage of 5 kV and at a magnification of 5000 times to obtain a reflected electron image as an image data.
(3) The obtained image data is subjected to automatic binarization processing, in which the data was binarized into a metal portion and a resin portion using ImageJ, image analysis software.
(4) The total area of the metal portion and the entire (metal portion+resin portion) area are obtained from the binarized image, and the total area of the metal portion is divided by the entire area to obtain the packing ratio P of the conductive particles in the cured thermosetting sheet.

The packing ratio P of the conductive particles was obtained by arithmetically averaging the packing ratios obtained for five cross-sectional areas in the exposed cross section that had been ion-polished. The packing ratio P of the conductive particles obtained for the thermosetting sheet according to each of Examples and Comparative Examples is shown in Table 3 below.

Thermal Conductivity of Thermosetting Sheet

The thermosetting sheet according to each of Examples and Comparative Examples was heat-cured using a pressure cooker apparatus under 0.5 MPa pressure at 200° C. for an hour. The thermal conductivity for the heat-cured thermosetting sheet according to each of Examples and Comparative Examples was calculated using the equation below:

Thermal conductivity (W/m·K)=Thermal diffusivity $(m^2/s)$×Specific heat (J/g·° C.)×Specific weight $(g/cm^3)$ The thermal diffusivity α $(m^2/s)$ was measured by the TWA method (temperature wave analysis, measuring instrument: ai-Phase Mobile manufactured by ai-Phase Co., Ltd.). The specific heat $C_p$ (J/g·° C.) was measured by the DSC method. In the specific heat measurement, DSC6220 manufactured by SII NanoTechnology Inc. was used at a temperature rising rate of 10° C./min and in a temperature range of 20 to 300° C. to obtain the data, based on which the specific heat was calculated according to the method stipulated in the JIS handbook (Testing Methods for Specific Heat Capacity of Plastics: K-7123). Specific weight was measured by the Archimedes method. The calculated thermal diffusivity for the cured thermosetting sheet according to each of Examples and Comparative Examples is shown in Table 3 below.

Arithmetic Average Roughness Ra and Maximum Height Roughness Ra

The arithmetic average roughness Ra and the maximum height roughness Rz were measured for the thermosetting sheet according to each of Examples. Specifically, they were measured by the non-contact roughness measurement method for the roughness curve of the surface of the thermosetting sheet according to each of Examples in the state before being cured with a cutoff value of 0.08 mm, using a "3CCD Color Confocal Microscope (model: OPTELICS H3000)" and a control software LM eye, which are manufactured by Lasertec Corporation. In the non-contact roughness measurement method, the microscope was manipulated under the conditions where the observation magnification was set to 500 times and the resolution was set to 0.05 μm. The arithmetic average roughness Ra and the maximum height roughness Rz both conform to the definition of JIS B0601: 2013.

Bonding Ratio

The bonding ratio of the thermosetting sheet according to each of Examples to the substrate was measured. In measuring the bonding ratio, the thermosetting sheet according to each of Examples was cut into a 5 cm square, and ten pieces of the 5 cm square cut sheet were laminated on each other and pressed under vacuum (under a pressure of 3.3 kPa) to obtain a sheet laminated body having a thickness of 300 μm. Then, a bare chip diced into a 5 cm square was attached to one side of the sheet laminated body to produce a sheet laminated body provided with a bare chip. The bonding ratio to the substrate was measured with the following steps:
(1) The opposite side to the one side of the sheet laminated body on which the bare chip is mounted is attached to a die pad area of a lead frame substrate (Cu lead frame substrate) to obtain a test piece for evaluating a bonding ratio.
(2) Using an ultrasonic image apparatus (model: FineSAT FS200II manufactured by Hitachi Kenki Finetech Co., Ltd.; hereinafter referred to also as SAT), a SAT image of the test piece for evaluating the bonding ratio is captured by the reflection method. In capturing the image, a gate is adjusted to conform to an echo of the bonded portion between the lead frame substrate and the sheet laminated body, the echo image displayed on the waveform monitor of the ultrasonic image apparatus, with a pixel set to 1, a gain set to 25 dB, and a Z-axis height set to 11.34 mm.
(3) The obtained SAT image is subjected to automatic binarization processing, in which the image is binarized into a bonded portion between the lead frame substrate and the sheet laminated body (hereinafter referred to also as bonded portion) and a non-bonded portion between the lead frame substrate and the sheet laminated body (hereinafter referred to also as non-bonded portion), using ImageJ, image analysis software. The threshold is set to 82.
(4) The area of the bonded portion and the area of the non-bonded portion are obtained from the binarized image, the area value of the bonded portion is divided by the sum of the area of the bonded portion and the area of the non-bonded portion, and the obtained value is then multiplied by 100 to thereby obtain the bonding ratio of the sheet laminated body to the lead frame substrate (i.e., the bonding ratio of the thermosetting sheet bonded to the lead frame substrate to the lead frame substrate).

In the binarized image, the bonded portion is shown in black while the non-bonded portion is shown in white.

The measured bonding ratio of the thermosetting sheet according to each of Examples to the substrate (lead frame substrate) is shown in Table 3 below.

TABLE 3

|  |  |  | Ex. 1 | Ex. 2 | Ex. 3 | Ex. 4 | Ex. 5 |
|---|---|---|---|---|---|---|---|
| Conductive particles | Ag particles | Ag particle type | AG-2-8F | AG-2-8F | AG-2-8F | HP02-B | HP02-B |
|  |  | Ag particle shape | Spherical | Spherical | Spherical | Spherical | Spherical |
|  |  | Ag particle $D_{50}$ [μm] | 0.9 | 0.9 | 0.9 | 0.58 | 0.58 |
|  |  | Ag particle $D_{90}$ [μm] | 1.6 | 1.6 | 1.6 | 1.15 | 1.15 |
|  |  | Ag particle coating material type | Aliphatic acid-based | Aliphatic acid-based | Aliphatic acid-based | Epoxy-based | Epoxy-based |
|  |  | Mass parts of Ag particles based on 100 mass parts of conductive particles | 70 | 70 | 70 | 70 | 70 |
|  | Ag-coated Cu particles | Ag-coated Cu particle type | AOP-TCY-2 (EN) | AOP-TCY-2 (EN) | AOP-TCY-2 (EN) | AOP-TCY-2 (EN) | AOP-TCY-2 (EN) |
|  |  | Ag-coated Cu particle shape | Spherical | Spherical | Spherical | Spherical | Spherical |
|  |  | Ag-coated Cu particle $D_{50}$ [μm] | 2.3 | 2.3 | 2.3 | 2.3 | 2.3 |
|  |  | Ag-coated Cu particle $D_{90}$ [μm] | 4 | 4 | 4 | 4 | 4 |
|  |  | Ag-coated Cu particle coating material type | Aliphatic acid-based | Aliphatic acid-based | Aliphatic acid-based | Aliphatic acid-based | Aliphatic acid-based |
|  |  | Mass parts of Ag-coated Cu particles based on 100 mass parts of conductive particles | 30 | 30 | 30 | 30 | 30 |
| Packing ratio P in cured thermosetting sheet [volume %] |  |  | 63.8 | 63.5 | 65.5 | 67.0 | 66.8 |
| Thermal conductivity of cured thermosetting sheet [W/m · K] |  |  | 21.7 | 17.2 | 20.3 | 11.7 | 16.7 |
| Surface roughness Ra [μm] |  |  | 0.75 | 0.84 | 1.10 | 0.88 | 0.80 |
| Maximum height roughness Rz [μm] |  |  | 7.18 | 7.50 | 8.33 | 7.41 | 6.53 |
| Bonding ratio [%] |  |  | 98.8 | 98.9 | 92.8 | 98.9 | 98.8 |

|  |  |  | Ex. 6 | Ex. 7 | C. Ex. 1 | C. Ex. 2 | C. Ex. 3 |
|---|---|---|---|---|---|---|---|
| Conductive particles | Ag particles | Ag particle type | AG-2-8F | AG-2-8F | HP02A | HP02A-B | HP02A-B |
|  |  | Ag particle shape | Spherical | Spherical | Spherical and aggregated | Spherical and aggregated | Spherical and aggregated |
|  |  | Ag particle $D_{50}$ [μm] | 0.9 | 0.9 | 0.75 | 0.75 | 0.75 |
|  |  | Ag particle $D_{90}$ [μm] | 1.6 | 1.6 | 7.59 | 7.59 | 7.59 |
|  |  | Ag particle coating material type | Aliphatic acid-based | Aliphatic acid-based | Aliphatic acid-based | Epoxy-based | Epoxy-based |
|  |  | Mass parts of Ag particles based on 100 mass parts of conductive particles | 70 | 70 | 24 | 24 | 70 |
|  | Ag-coated Cu particles | Ag-coated Cu particle type | 20% Ag/1200Y | 20% Ag/03K | 10% Ag/1200YP-B | 10% Ag/1200YP-B | 10% Ag/1200YP-B |
|  |  | Ag-coated Cu particle shape | Spherical | Spherical | Flat | Flat | Flat |
|  |  | Ag-coated Cu particle $D_{50}$ [μm] | 2.4 | 3.5 | 3.4 | 3.4 | 3.4 |
|  |  | Ag-coated Cu particle $D_{90}$ [μm] | 4.95 | 6.5 | 5.7 | 5.7 | 5.7 |
|  |  | Ag-coated Cu particle coating material type | Aliphatic acid-based | Aliphatic acid-based | Epoxy-based | Epoxy-based | Epoxy-based |
|  |  | Mass parts of Ag-coated Cu particles based on 100 mass parts of conductive particles | 30 | 30 | 76 | 76 | 30 |
| Packing ratio P in cured thermosetting sheet [volume %] |  |  | 62.1 | 64.0 | 46.4 | 51.8 | 56.0 |
| Thermal conductivity of cured thermosetting sheet [W/m · k] |  |  | 11.7 | 11.7 | 4.39 | 5.08 | 8.25 |
| Surface roughness Ra [μm] |  |  | 0.76 | 0.74 | 1.29 | 1.45 | 1.31 |
| Maximum height roughness Rz [μm] |  |  | 7.60 | 8.83 | 14.18 | 15.50 | 14.68 |
| Bonding ratio [%] |  |  | 96.3 | 97.5 | 42.3 | 39.9 | 42.8 |

It is found from Table 3 that in the thermosetting sheet according to each of Examples, the arithmetic average roughness Ra value measured in the state before being cured falls within a range of 0.1 μm or more and 1.2 μm or less. The thermosetting sheet according to each of Examples has a thermal conductivity as relatively high as 3 W/m·K or more after being cured, and has a bonding ratio to the lead frame substrate of 70% or more in the state before being cured. In the thermosetting sheet according to each of Examples, the maximum height roughness Rz measured in the state before being cured falls within a range of 1 μm or more and 12 μm or less.

In contrast, in the thermosetting sheet according to each of Comparative Examples, the arithmetic average roughness Ra value measured in the state before being cured does not fall within a range of 0.1 μm or more and 1.2 μm or less. The cured thermosetting sheet according to each of Comparative Examples has a thermal conductivity that is as relatively high as 3 W/m·K or more but lower than that of the thermosetting sheet according to each of Examples. The thermosetting sheet according to each of Comparative Examples before being cured has a bonding ratio to the lead frame substrate of less than 70%. In the thermosetting sheet according to each of Comparative Examples, the maximum height roughness Rz measured in the state before being cured does not fall within a range of 1 μm or more and 12 μm or less.

It is found from these results that the thermosetting sheet that includes a thermosetting resin, a thermoplastic resin, a volatile component, and conductive particles, and that has an arithmetic average roughness Ra measured in the state before being cured that falls within a range of 0.1 μm or more and 1.2 μm or less can increase its tight adhesiveness to a substrate having a semiconductor device mounting area, and can have relatively high thermal conductivity after being cured.

REFERENCE SIGNS LIST

1: Base layer
2: Adhesive layer
3: Thermosetting sheet
10: Dicing tape
20: Dicing die bonding film 30: Semiconductor apparatus
31: Lead frame substrate
32: Semiconductor device
33: Wire
34: Package
35: Mold resin
40: Wiring board
41: Electrode
31a: Die pad
31b: Lead

What is claimed is:

1. A thermosetting sheet comprising:
a thermosetting resin;
a thermoplastic resin;
a volatile component; and
conductive particles,
the thermosetting sheet having an arithmetic average roughness Ra of 0.1 μm or more and 1.2 μm or less that is measured in a state before being cured,
the thermosetting sheet having a maximum height roughness Rz of 1 μm or more and 12 μm or less that is measured in the state before being cured.

2. The thermosetting sheet according to claim 1, wherein the conductive particles in the cured thermosetting sheet have a packing ratio P of 30 volume % or more.

3. The thermosetting sheet according to claim 1, wherein a thermal conductivity after being cured is 3 W/m·K or more.

4. A dicing die bonding film comprising:
a base layer;
an adhesive layer laminated on the base layer to form a dicing tape; and
a thermosetting sheet laminated on the adhesive layer of the dicing tape, wherein
the thermosetting sheet is the thermosetting sheet according to claim 1.

5. A semiconductor apparatus comprising:
a substrate having a semiconductor device mounting area; and
a semiconductor device mounted on the semiconductor device mounting area, wherein
the semiconductor device is mounted on the semiconductor device mounting area of the substrate via a thermosetting sheet,
the thermosetting sheet is cured,
a bonding ratio of the thermosetting sheet to the substrate is 70% or more, and
the thermosetting sheet is the thermosetting sheet according to claim 1.

* * * * *